United States Patent
Cheng et al.

(10) Patent No.: US 9,801,280 B2
(45) Date of Patent: Oct. 24, 2017

(54) ELECTRONIC DEVICE AND CIRCUIT MODULE THEREOF

(71) Applicant: ALSON TECHNOLOGY LIMITED, Kowloon, OT (HK)

(72) Inventors: Han-Hung Cheng, Zhubei (TW); Chi-Fen Kuo, Zhubei (TW)

(73) Assignee: Alson Technology Limited, Kowloon (HK)

( * ) Notice: Subject to any disclaimer, the term of this patent is extended or adjusted under 35 U.S.C. 154(b) by 123 days.

(21) Appl. No.: 14/940,624

(22) Filed: Nov. 13, 2015

(65) Prior Publication Data

US 2017/0142832 A1    May 18, 2017

(51) Int. Cl.

| | |
|---|---|
| *H05K 1/18* | (2006.01) |
| *G06F 1/18* | (2006.01) |
| *G09F 13/04* | (2006.01) |
| *G09F 23/00* | (2006.01) |

(52) U.S. Cl.
CPC ............... *H05K 1/18* (2013.01); *G06F 1/185* (2013.01); *G09F 13/04* (2013.01); *G09F 23/00* (2013.01); *H05K 2201/10106* (2013.01); *H05K 2201/10121* (2013.01)

(58) Field of Classification Search
CPC .......... H05K 1/18; H05K 2201/10106; H05K 2201/10121; G06F 1/185; G09F 13/04; G09F 23/00

USPC ................. 40/431, 452, 550, 563, 564, 582; 362/235, 249.02, 812, 97.1, 652, 657, 362/658, 659

See application file for complete search history.

(56) References Cited

U.S. PATENT DOCUMENTS 6,634,124 B1 *  10/2003  Bierschbach ......... G09F 9/3026
                                                              40/452

FOREIGN PATENT DOCUMENTS

TW              M448772 U      3/2013

* cited by examiner

*Primary Examiner* — Laura Tso
(74) *Attorney, Agent, or Firm* — Muncy, Geissler, Olds & Lowe, P.C.

(57) ABSTRACT

A circuit module includes a main body and a PCI-E insert row, the main body has a substrate portion and a light-emitting portion, the substrate portion includes a board and a first coating layer, the board has a light-transmittable portion and a first face, the first coating layer is coated on the first face, the first coating layer has an emergent light-transmittable portion corresponding to the light-transmittable portion. The PCI-E insert row is disposed on the substrate portion. The electronic device includes the circuit module mentioned above and further includes a shell portion. The shell portion is covered on two opposite lateral faces of the circuit module and at least shields the light-emitting portion, and the shell portion further has a second light-transmittable portion corresponding to the emergent light-transmittable portion.

10 Claims, 4 Drawing Sheets

ELECTRONIC DEVICE AND CIRCUIT MODULE THEREOF

BACKGROUND OF THE INVENTION

Field of the Invention

The present invention relates to an electronic device and a circuit module thereof.

Description of the Prior Art

An electronic device and a circuit module thereof as disclosed in TWM448772 includes a main body, at least one light-emitting diode and at least one translucent light-guiding body. The light-emitting diode is disposed in the main body and electrically connected with the main body, the light-guiding body is disposed on the main body and covers the light-emitting diode, and light from the light-emitting diode can penetrate through the light-guiding body.

However, when this type of the electronic device and the circuit module thereof are in actual practice, the light-guiding body needs to be further covered on the light-emitting diode; therefore, the electronic device is too thick, and the manufacturing cost is higher.

The present invention has arisen to mitigate and/or obviate the afore-described disadvantages.

SUMMARY OF THE INVENTION

The major object of the present invention is to provide an electronic device and a circuit module thereof, wherein light is emitted via a substrate and an emergent light-transmittable portion of a coating layer without a light-guiding portion which needs to be further disposed. Therefore, a thickness of the present invention decreases, and a manufacturing cost of the present invention is lower.

To achieve the above and other objects, a circuit module is provided, including a main body and a Peripheral Component Interconnect Express (PCI Express, PCI-E) insert row. The main body has a substrate portion and a light-emitting portion. The substrate portion includes a board and a first coating layer, the board has a light-transmittable portion and a first face, the first coating layer is coated on the first face, the first coating layer is formed with an emergent light-transmittable portion corresponding to the light-transmittable portion, light from the light-emitting portion can be projected through the light-transmittable portion and projected via the emergent light-transmittable portion to an exterior of the circuit module. The PCI-E insert row is disposed on the substrate portion.

To achieve the above and other objects, an electronic device is further provided, including the circuit module mentioned above, and further including a shell portion. The shell portion is covered on two opposite lateral faces of the circuit module and at least shields the light-emitting portion. The shell portion further has a second light-transmittable portion corresponding to the emergent light-transmittable portion, and light projected from the emergent light-transmittable portion can be projected through the second light-transmittable portion to an exterior of the electronic device.

The present invention will become more obvious from the following description when taken in connection with the accompanying drawings, which show, for purpose of illustrations only, the preferred embodiment(s) in accordance with the present invention.

DETAILED DESCRIPTION OF THE PREFERRED EMBODIMENTS

The present invention will be clearer from the following description when viewed together with the accompanying drawings, which show, for purpose of illustrations only, the preferred embodiment in accordance with the present invention.

Figure 1:
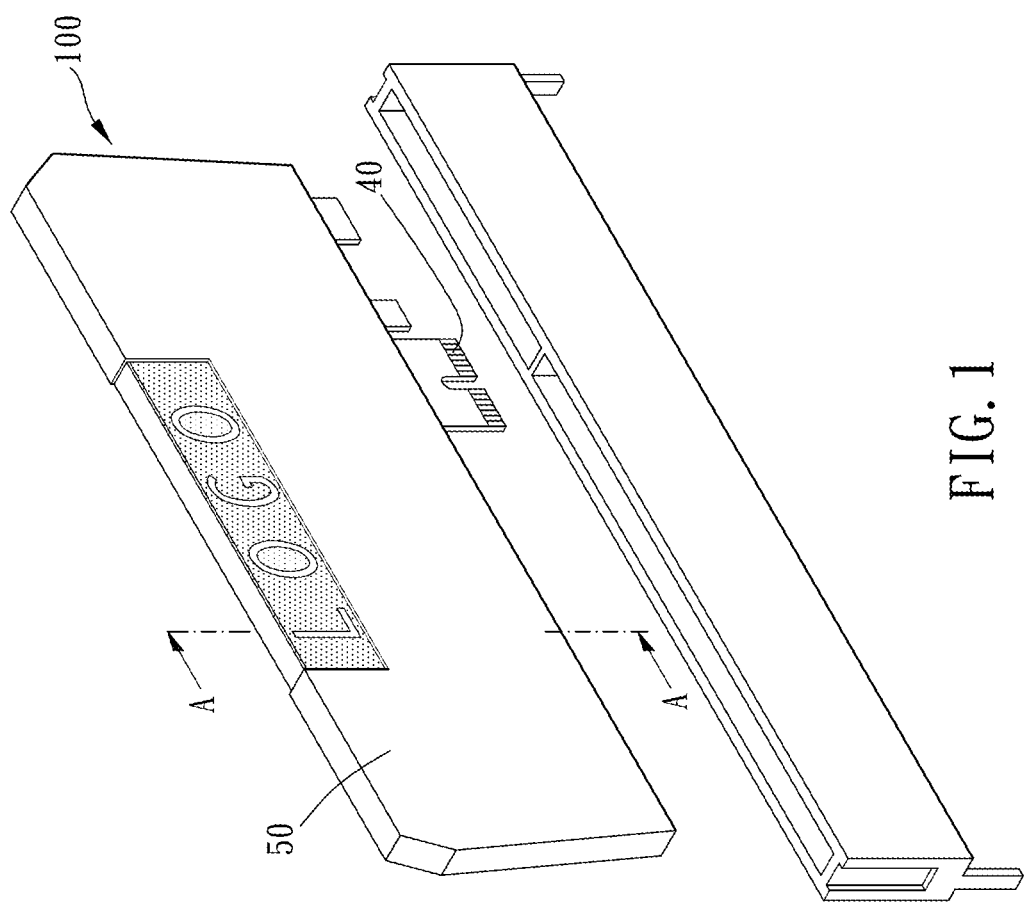
FIG. 1 is a perspective view of a preferred embodiment of the present invention.
Figure 2:
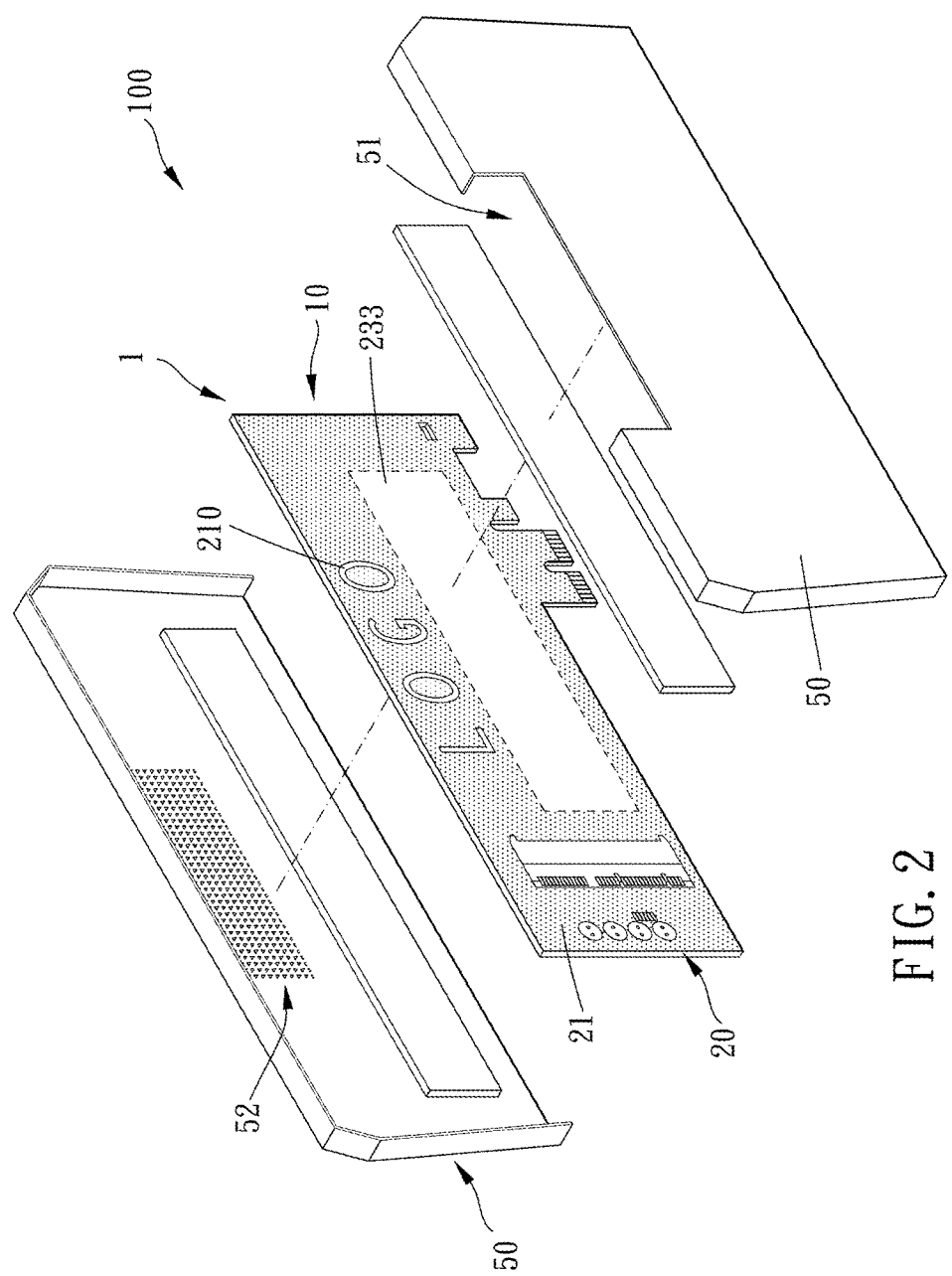
FIG. 2 is a breakdown view of the preferred embodiment of the present invention.
Figure 3:
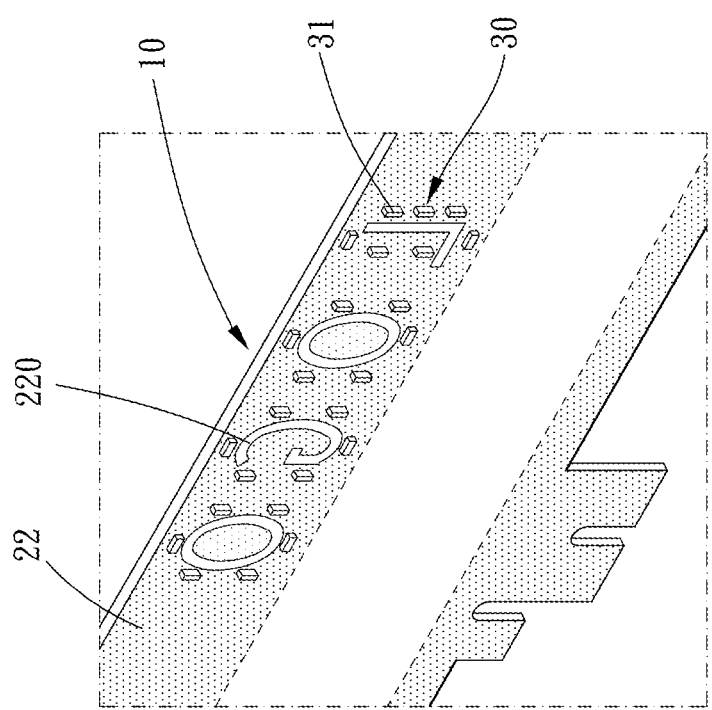
FIG. 3 is a rear view of a circuit module of the preferred embodiment of the present invention.
Figure 4:
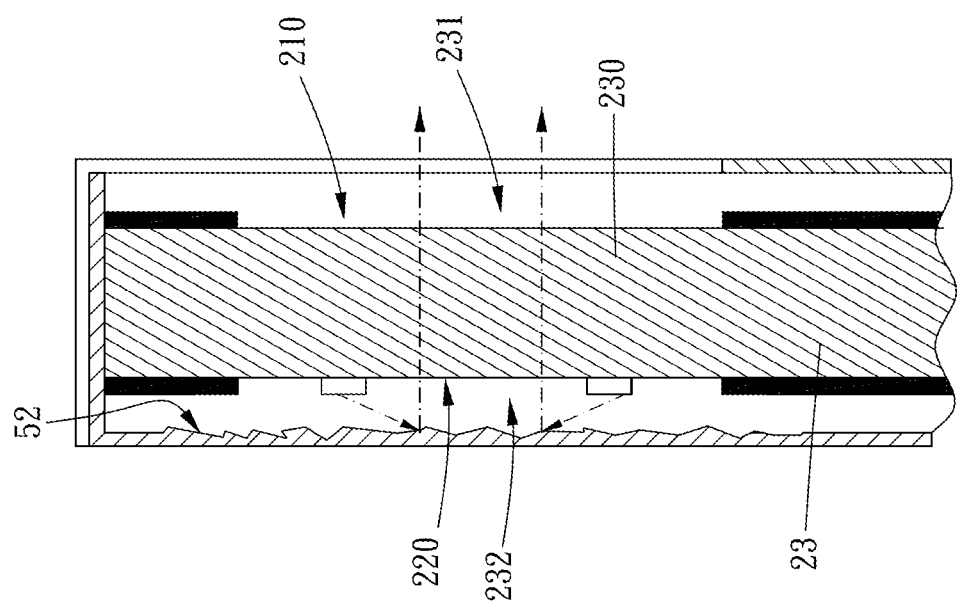
FIG. 4 is a cross-sectional view of the present invention, taken along line A-A in FIG. 1.

Please refer to FIGS. 1 to 4 for an electronic device 100 and a circuit module 1 thereof of a preferred embodiment of the present invention. The circuit module 1 includes a main body 10 and a Peripheral Component Interconnect Express (PCI Express, PCI-E) insert row 40.

The main body 10 has a substrate portion 20 and a light-emitting portion 30. The substrate portion 20 is provided with an electronic unit 233, the PCI-E insert row 40 is disposed on the substrate portion 20, and the PCI-E insert row 40 is electrically connected with the electronic unit 233. More specifically, the light-emitting portion 30 is also electrically connected with the PCI-E insert row 40 (the light-emitting portion may be further electrically connected with other exterior powers such as a mother board). In this embodiment, the electronic unit 233 may be a graphic processing module, a display processing module or other processing modules so that the circuit module 1 can serve as a graphic card, a display card or other devices. It is understandable that the PCI-E insert row 40 can transmit not only electricity but also data.

The substrate portion 20 includes a board 23 and a first coating layer 21. Specifically, the board 23 has a light-transmittable portion 230 and a first face 231, the first coating layer 21 is coated on the first face 231, the first coating layer 21 is formed with an emergent light-transmittable portion 210 corresponding to the light-transmittable portion 230, and light from the light-emitting portion 30 can be projected through the light-transmittable portion 230 and projected via the emergent light-transmittable portion 210 to an exterior of the circuit module 1. In this embodiment, the board 23 further has a second face 232. More specifically, the first face 231 is opposite to the second face 232, the substrate portion 20 includes a second coating layer 22 coated on the second face 232, the second coating layer 22 is formed with an incident light-transmittable portion 220 corresponding to the light-transmittable portion 230, and the light from the light-emitting portion 30 can be projected through the incident light-transmittable portion 220 to the light-transmittable portion 230. In other embodiments, the light from the light-emitting portion can be transmitted without the second coating layer and the incident light-transmittable portion; or, the light from the light-emitting portion can enter through other regions (for example, other lateral faces other than the second face) of the board instead of the second face.

In this embodiment, the first coating layer 21 and the second coating layer 22 are insulating coating layers of a normal circuit board, and the incident light-transmittable portion 220 and the emergent light-transmittable portion 210 are hollow-out structures which are not coated. In other embodiments, the incident and emergent light-transmittable portions may be layers made of a light-transmittable material. Specifically, the emergent light-transmittable portion 210 is a light-transmittable pattern portion (for example, a trademark), and the present invention is more appealing when being viewed from outside (the incident light-transmittable portion may also be a pattern portion corresponding to the emergent light-transmittable portion).

Specifically, the light-emitting portion 30 is disposed on the substrate portion 20, and the light-emitting portion 30 is disposed neighboring to the incident light-transmittable portion 220. The light-emitting portion 30 includes a plurality of light-emitting diodes 31 which are disposed on the substrate portion 20 along a contour of the incident light-transmittable portion 220, so light from the emergent light-transmittable portion 210 is brighter and more even. In other embodiments, the light-emitting portion may be disposed not on the substrate portion as long as the light from the light-emitting portion can enter the light-transmittable portion directly or indirectly.

The electronic device 100 includes the circuit module 1 mentioned above and further includes a shell portion 50.

The shell portion 50 is covered on two opposite lateral faces of the circuit module 1 and at least shields the light-emitting portion 30 so as to prevent the light from the light-emitting portion 30 from being too harsh to human eyes. The shell portion 50 further has a second light-transmittable portion 51 corresponding to the emergent light-transmittable portion 210, and the light projected from the emergent light-transmittable portion 210 can be projected through the second light-transmittable portion 51 to an exterior of the electronic device 100. It is understandable that the second light-transmittable portion 51 may be a hollow-out structure or a layer made of a light-transmittable material.

Preferably, a reflection structure 52 is disposed on the shell portion 50 and corresponds to the light-emitting portion 30, and the reflection structure 52 reflects a part of the light from the light-emitting portion 30 to the light-transmittable portion 230. More specifically, the reflection structure 52 is a height-differentiated structure (of course, the reflection structure 52 may be a flat reflective surface) so that the light can be irregularly reflected and evenly projected to the light-transmittable portion 230. In this embodiment, the shell portion 50 is a heat-dissipating shell portion (the shell portion may made of, for example, a metal) to prevent the circuit module 1 from overheating.

Given the above, the electronic device and the circuit module thereof, wherein light is emitted via the substrate and the emergent light-transmittable portion of the coating layer without a light-guiding portion which needs to be further disposed. Therefore, a thickness of the present invention decreases, and a manufacturing cost of the present invention is lower.

While we have shown and described various embodiments in accordance with the present invention, it should be clear to those skilled in the art that further embodiments may be made without departing from the scope of the present invention.

What is claimed is:

1. A circuit module, including:
    a main body, having a substrate portion and a light-emitting portion, the substrate portion including a board and a first coating layer, the board having a light-transmittable portion and a first face, the first coating layer being coated on the first face, the first coating layer being formed with an emergent light-transmittable portion corresponding to the light-transmittable portion, light from the light-emitting portion being projectable through the light-transmittable portion and projectable via the emergent light-transmittable portion to an exterior of the circuit module;
    a Peripheral Component Interconnect Express (PCI Express, PCI-E) insert row, disposed on the substrate portion.

2. The circuit module of claim 1, wherein the board further has a second face, the substrate portion further includes a second coating layer coated on the second face, the second coating layer is formed with an incident light-transmittable portion corresponding to the light-transmittable portion, the light from the light-emitting portion is projectable through the incident light-transmittable portion to the light-transmittable portion, the light-emitting portion is disposed on the substrate portion, and the light-emitting portion is arranged neighboring to the incident light-transmittable portion.

3. The circuit module of claim 2, wherein the light-emitting portion includes a plurality of light-emitting diodes which are disposed on the substrate portion along a contour of the incident light-transmittable portion.

4. The circuit module of claim 1, wherein the emergent light-transmittable portion is a light-transmittable pattern portion, and the emergent light-transmittable portion is a hollow-out structure or a layer made of a light-transmittable material.

5. The circuit module of claim 1, wherein the substrate portion is further provided with an electronic unit, the electronic unit is electrically connected with the PCI-E insert row, and the electronic unit is either a graphic processing module or a display processing module.

6. An electronic device, including the circuit module of claim 1, further including:
    a shell portion, covered on two opposite lateral faces of the circuit module and at least shielding the light-emitting portion, the shell portion further having a second light-transmittable portion corresponding to the emergent light-transmittable portion, and light projected from the emergent light-transmittable portion being projectable through the second light-transmittable portion to an exterior of the electronic device.

7. The electronic device of claim 6, wherein a reflection structure is disposed on the shell portion and corresponds to the light-emitting portion, and the reflection structure reflects a part of the light from the light-emitting portion to the light-transmittable portion.

8. The electronic device of claim 7, wherein the reflection structure is a height-differentiated structure.

9. The electronic device of claim 6, wherein the second light-transmittable portion is a hollow-out structure or a layer made of a light-transmittable material.

10. The electronic device of claim 6, wherein the shell portion is a heat-dissipating shell portion.

* * * * *